United States Patent
Yoshimizu et al.

(10) Patent No.: US 10,720,321 B2
(45) Date of Patent: Jul. 21, 2020

(54) SUBSTRATE TREATING METHOD AND SEMICONDUCTOR DEVICE MANUFACTURING METHOD

(71) Applicant: Toshiba Memory Corporation, Minato-ku (JP)

(72) Inventors: Yasuhito Yoshimizu, Yokkaichi (JP); Fuyuma Ito, Yokkaichi (JP); Naomi Yanai, Kuwana (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/296,816

(22) Filed: Mar. 8, 2019

(65) Prior Publication Data
US 2020/0075315 A1 Mar. 5, 2020

(30) Foreign Application Priority Data
Aug. 30, 2018 (JP) .................. 2018-161568

(51) Int. Cl.
*H01L 21/02* (2006.01)
*H01L 21/324* (2006.01)
*H01L 21/033* (2006.01)
*H01L 21/306* (2006.01)

(52) U.S. Cl.
CPC .. *H01L 21/02057* (2013.01); *H01L 21/02052* (2013.01); *H01L 21/0337* (2013.01); *H01L 21/30604* (2013.01); *H01L 21/324* (2013.01)

(58) Field of Classification Search
None
See application file for complete search history.

(56) References Cited

U.S. PATENT DOCUMENTS

| | | | | |
|---|---|---|---|---|
| 3,950,586 A * | 4/1976 | Davey | ............... | H01B 3/085 428/195.1 |
| 5,122,777 A * | 6/1992 | Shiratsuki | ............ | H01C 7/003 338/306 |
| 7,223,802 B2 * | 5/2007 | Aoki | ............... | C01B 33/04 257/E21.114 |
| 9,536,797 B2 | 1/2017 | Igarashi et al. | | |
| 2009/0204252 A1 | 8/2009 | Miyoshi et al. | | |
| 2013/0008868 A1 | 1/2013 | Uozumi et al. | | |
| 2017/0301580 A1 * | 10/2017 | Yoshihara | ........ | H01L 21/02057 |
| 2018/0076018 A1 * | 3/2018 | Otsuji | ............... | H01L 21/02057 |
| 2018/0208611 A1 * | 7/2018 | Seok | ............... | C07F 7/24 |

FOREIGN PATENT DOCUMENTS

| | | |
|---|---|---|
| JP | 5259125 | 8/2013 |
| JP | 5622675 | 11/2014 |
| JP | 5806645 | 11/2015 |
| JP | 2016-25233 | 2/2016 |
| JP | 2018-22861 | 2/2018 |

* cited by examiner

*Primary Examiner* — Allan W. Olsen
(74) *Attorney, Agent, or Firm* — Oblon, McClelland, Maier & Neustadt, L.L.P.

(57) ABSTRACT

According to one embodiment, a substrate treating method includes: providing a first liquid onto a pattern on a substrate; providing, after the first liquid is provided, a second liquid containing a first substance to form a film containing the first substance on the pattern; providing, after the second liquid is provided onto the pattern, a third liquid; turning the third liquid into gas; and turning, after the third liquid is turned into gas, the film into gas.

20 Claims, 5 Drawing Sheets

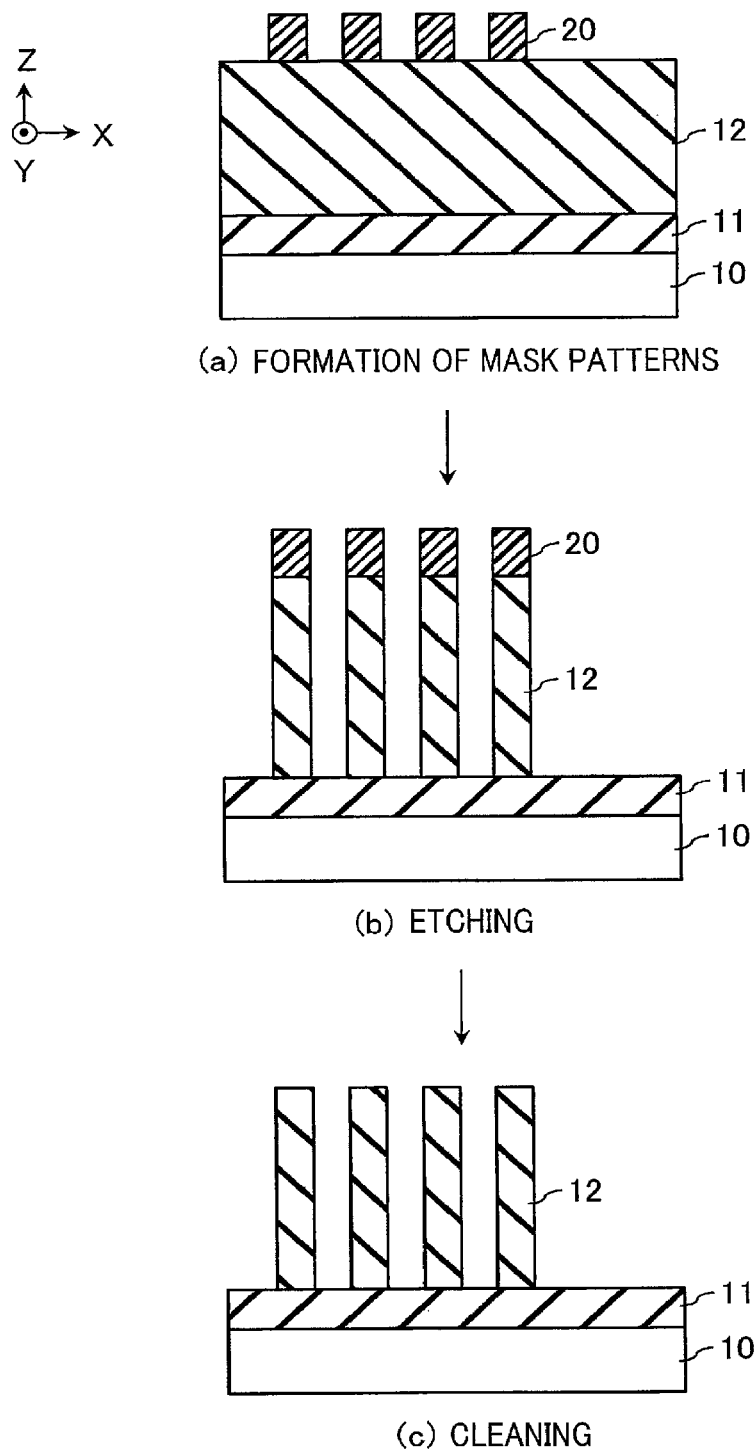
F I G. 1

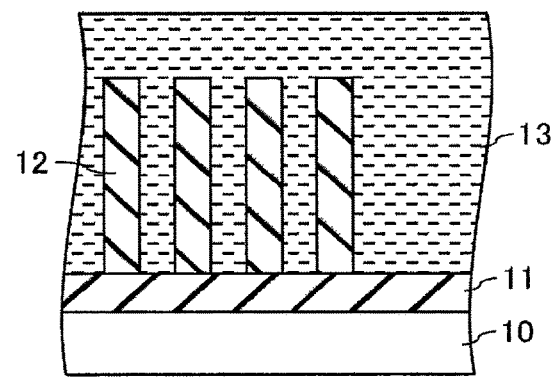
(a) SOLVENT SUBSTITUTION
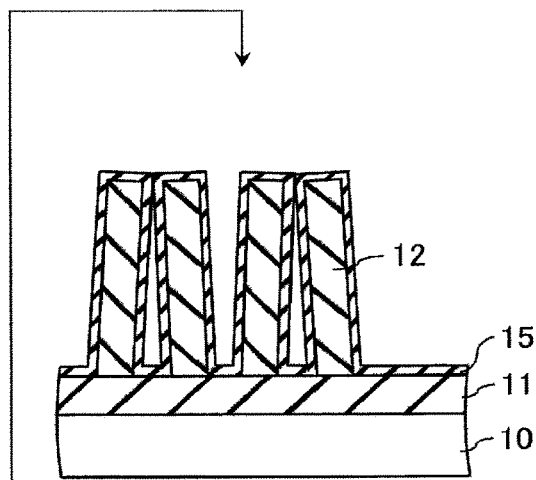
(c) SOLVENT RINSING & DRYING
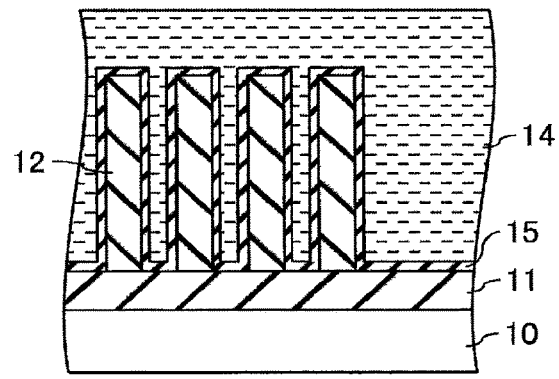
(b) FILM TREATMENT
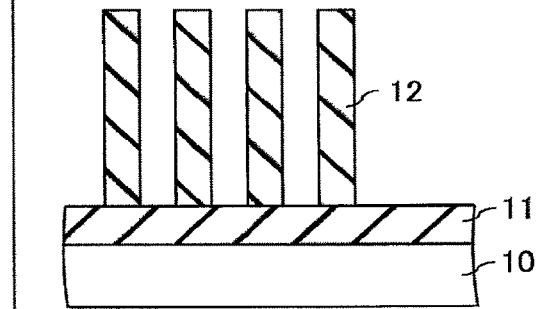
(d) SUBLIMATION (OR VOLATILIZATION) OF FILM
F I G. 3

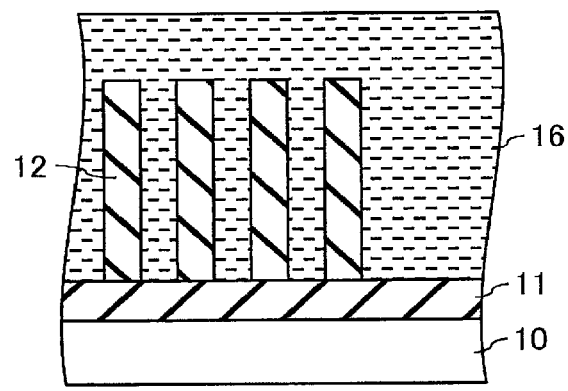
IPA SUBSTITUTION
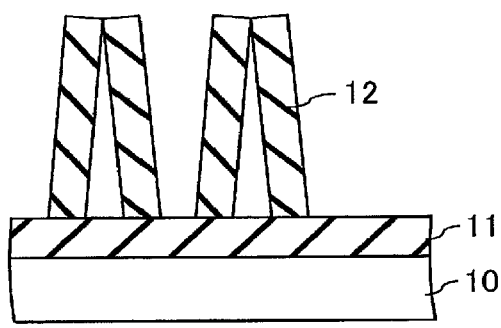
DRYING
F I G. 5

SUBSTRATE TREATING METHOD AND SEMICONDUCTOR DEVICE MANUFACTURING METHOD

CROSS-REFERENCE TO RELATED APPLICATIONS

This application is based upon and claims the benefit of priority from Japanese Patent Application No. 2018-161568, filed Aug. 30, 2018, the entire contents of which are incorporated herein by reference.

FIELD

Embodiments described herein relate generally to a substrate treating method and a semiconductor device manufacturing method.

BACKGROUND

Processes for manufacturing a semiconductor device include subjecting a semiconductor substrate to wet treatment followed by drying, during which fine patterns on the surface of the substrate are often plastically deformed due to the surface tension of a wash liquid.

BRIEF DESCRIPTION OF THE DRAWINGS

FIG. 1 presents diagrams showing a flow of forming line patterns by dry etching in a semiconductor device manufacturing method according to a certain embodiment.

FIG. 3 presents diagrams each showing a cross-section of a semiconductor substrate in relation to a corresponding step within a cleaning process in a substrate treating method according to a certain embodiment.

FIG. 5 presents diagrams each showing a cross-section of a semiconductor substrate when an IPA drying is adopted as a comparative example.

DETAILED DESCRIPTION

In general, according to one embodiment, a substrate treating method includes: providing a first liquid onto a pattern on a substrate; providing, after the first liquid is provided, a second liquid containing a first substance to form a film containing the first substance on the pattern; providing, after the second liquid is provided, a third liquid onto the pattern; turning the third liquid into gas; and turning, after the third liquid is turned into gas, the film into gas.

The embodiment will now be described, assuming an instance where the embodiment is applied to a cleaning process (resist removing process) after formation of fine line patterns on a semiconductor substrate. Note that the substrate treating method according to this embodiment is not limited to the application to such a cleaning process. For example, the embodiment is also applicable to wet etching processes, surface treating processes that use a chemical solution, developing treatment after exposure in photolithography, or any processes intended to treat semiconductor substrates in a liquid phase.

1. Flow of Pattern Formation

First, the flow of line pattern formation by dry etching will be described with reference to FIG. 1. FIG. 1 shows an example where multiple line patterns are formed by processing an insulation layer on a semiconductor substrate. Note that the embodiment does not limit materials to be processed, or shapes of patterns. For example, patterns may be formed by processing a metal material.

As shown in FIG. 1 (a), an insulation layer 11 is formed on a semiconductor substrate 10, and subsequently, an insulation layer 12 as an etching target film is formed on the insulation layer 12. Then, mask patterns using resists 20 are formed by photolithography. In the example shown in FIG. 1, multiple mask patterns each extending in a Y-direction parallel to the semiconductor substrate 10 are arranged along with an X-direction parallel to the semiconductor substrate 10 and perpendicular to the Y-direction.

Next, as shown in FIG. 1 (b), the insulation layer 12 is processed by dry etching to form multiple line patterns each extending in a Z-direction perpendicular to the semiconductor substrate 10. After the dry etching, there are the resists 20 remaining on the insulation layer 12.

Next, as shown in FIG. 1 (c), the resists 20, etching residues, etc. are removed in a cleaning process. The resists 20 are removed by, for example, a sulfuric acid hydrogen peroxide mixture (SPM), i.e., a mixture of sulfuric acid and a hydrogen peroxide solution.

2. Details of Drying Step

Figure 2:
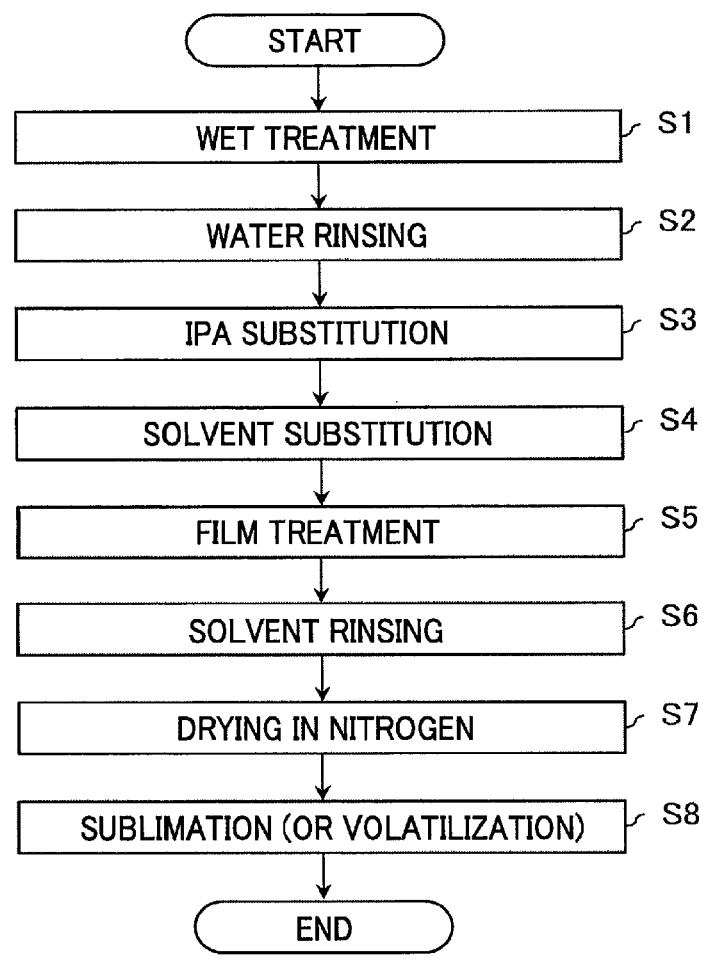
FIG. 2 is a flowchart indicating each step within a cleaning process in a substrate treating method according to a certain embodiment.

The aforementioned cleaning process involves a drying step, which will be described in detail with reference to FIGS. 2 and 3. FIG. 2 is a flowchart indicating each step within the cleaning process, and FIG. 3 shows cross-sections of a semiconductor substrate after the respective corresponding steps within the cleaning process. Note that the term "pattern surface" appearing in the following description will refer to surfaces including, for example, the surface of the insulation layer 11 and the surfaces of the line patterns, i.e., the surface of the insulation layer 12 shaped on the insulation layer 11, as explained with reference to FIG. 1.

Initially, as indicated in FIG. 2, wet treatment is performed with a supply of a chemical liquid to the pattern surface (step S1). The chemical liquid is not limited to the aforementioned SPM. For example, the wet treatment may employ a chemical liquid which is a mixture of a hydrogen peroxide solution and any of aqueous ammonia, hydrochloric acid, and hydrofluoric acid. The wet treatment may also be constituted by a combination of multiple treatment operations using more than one type of chemical liquids.

After the wet treatment, the pattern surface is rinsed by, for example, deionized water (DIW) (step S2), without drying. That is, the water rinsing step is performed with the pattern surface still wet with the chemical liquid (in a non-dry state). This removes the chemical liquid adhered to the pattern surface.

After the water rinsing, substitution with isopropyl alcohol (IPA) is performed while the pattern surface is wet with the DIW (step S3). According to this embodiment, if a solvent which will be used in the next step, i.e., solvent substitution, does not mix with water, the surrounding water is replaced with IPA at this stage. The substitute is not limited to the IPA, and any liquid may be used as long as it can mix with the solvent. Moreover, the IPA substitution step may be omitted depending on the solvent selected.

After the IPA substitution, substitution with the solvent is performed while the pattern surface is wet with the IPA (step S4). This solvent substitution step employs the same solvent as used for preparing a later-described solution (hereinafter, may be simply called "solution") for forming a film (coating). However, the solvent which can be employed in the solvent substitution step is not limited to the solvent of the solution (for forming a film). The solvent may be any liquid (first liquid) that does not contain a solute for forming the film. The solvent is preferably an organic solvent free from water molecules as its contents, so that a reaction between the solute and water in the solution will be suppressed. Specific examples of the organic solvent include: monoethers of glycols, such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monophenyl ether, dipropylene glycol monomethyl ether, dipropylene glycol monoethyl ether, dipropylene glycol monopropyl ether, dipropylene glycol monobutyl ether, dipropylene glycol monophenyl ether, triethylene glycol monomethyl ether, triethylene glycol monoethyl ether, tripropylene glycol monomethyl ether, and tripropylene glycol monoethyl ether; monoethers such as diisopentyl ether, diisobutyl ether, benzyl methyl ether, benzyl ethyl ether, dioxane, tetrahydrofuran, anisole, perfluoro-2-butyltetrahydrofuran, and perfluorotetrahydrofuran; chain diethers of glycols, such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dipropyl ether, propylene glycol dibutyl ether, diethylene glycol dimethyl ether, diethylene glycol diethyl ether, diethylene glycol dipropyl ether, diethylene glycol dibutyl ether, dipropylene glycol dimethyl ether, dipropylene glycol diethyl ether, dipropylene glycol dipropyl ether, and dipropylene glycol dibutyl ether; cyclic diethers such as 1,4-dioxane; ketones such as 1-octanone, 2-octanone, 1-nonanone, 2-nonanone, acetone, 2-heptanone, 4-heptanone, 1-hexanone, 2-hexanone, 3-pentanone, diisobutyl ketone, cyclohexanone, methyl cyclohexanone, phenyl acetone, methyl ethyl ketone, methyl isobutyl ketone, ethyl isobutyl ketone, acetylacetone, acetonylacetone, ionone, diacetonyl alcohol, acetyl carbinol, acetophenone, methyl naphthyl ketone, and isophorone; esters such as methyl acetate, butyl acetate, ethyl acetate, isopropyl acetate, pentyl acetate, isopentyl acetate, ethyl methoxyacetate, ethyl ethoxyacetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, propylene glycol monomethyl ether acetate, propylene glycol monoethyl ether acetate, propylene glycol monopropyl ether acetate, propylene glycol monobutyl ether acetate, propylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl 3-ethoxypropionate, propyl-3-methoxypropionate, isopropyl-3-methoxypropionate, propylene carbonate, and γ-butyrolactone; amide series solvents having no active hydrogen atom, such as N-methyl-2-pyrrolidone, N,N-dimethylacetamide, N,N-dimethylformamide, hexamethylphosphoric triamide, and 1,3-dimethyl-2-imidazolidinone; sulfoxides such as dimethylsulfoxide; aliphatic hydrocarbon series solvents which may contain halogen, such as pentane, hexane, octane, decane, 2,2,4-trimethylpentane, 2,2,3-trimethylhexane, perfluorohexane, perfluoroheptane, limonene, and pinene; aromatic hydrocarbon series solvents such as benzene, toluene, xylene, ethylbenzene, propylbenzene, 1-methylpropylbenzene, 2-methylpropylbenzene, diethylbenzene, ethyl methyl benzene, trimethylbenzene, ethyl dimethyl benzene, and dipropylbenzene; monovalent alcohols such as methanol, ethanol, n-propanol, isopropanol, butanol, isobutanol, 2-methoxyethanol, 2-ethoxyethanol, 3-methyl-3-methoxybutanol, hexanol, cyclohexanol, benzyl alcohol, and 2-phenoxyethanol; and glycols such as ethylene glycol, propylene glycol, diethylene glycol, and dipropylene glycol. Each of them may be used independently, or two or more of them may be used in combination.

After the solvent substitution, a film formation step is performed (step S5). More specifically, substitution with the solution (second liquid) is performed while the pattern surface is wet with the solvent (first liquid). When the solution is supplied to the pattern surface, the solute in the solution undergoes hydrolysis with the water molecules adsorbed onto the pattern surface, and forms a film on the pattern surface (such a reaction will be called "solid-liquid interface reaction"). The thickness of the film is limited by the amount of the water molecules adsorbed onto the pattern surface. Accordingly, the film does not grow to the thickness of burying the patterns in their entirety, or filling the gap between the patterns. In other words, the film is formed only on the pattern surface, and the pattern surface covered by the film is further surrounded by the solution.

As the solute, for example, an organic boron compound is used. In this case, the film will include boron (e.g., boric acid). The solute may also contain organic silane as a silane coupler. As the organic boron compound, for example, any one or combination of trimethoxyboron, triethoxyboron, trimethylboron, triethylboron, and triethylamine borane may be used. However, the solute is not limited to the organic boron compounds. For example, the solute may be of any materials that can form a film capable of sublimating or volatilizing (that is, turning into gas) under the atmospheric pressure or lower.

After formation of the film, a rinsing step is performed with the solvent (third liquid) while the pattern surface is wet with the solution (second liquid) (step S6). This removes the solution, as well as the solute which has not reacted with the pattern surface. As such, the film remains on the pattern surface.

Note that the solvent employed in this rinsing step is not limited to the same solvent as that of the solution for forming the film. For example, the solvent for the rinsing step may be any liquid that does not contain the solute. For example, an organic solvent free from water molecule contents may be adopted so that the hydrolysis of the solute, and resulting deposition, will be prevented.

After the rinsing step with the solvent, the solvent is removed by drying the pattern surface in, for example, a nitrogen atmosphere (step S7). The atmosphere for drying is not limited to the nitrogen atmosphere. An atmosphere having a low moisture concentration is intended for the purpose of regulating the sublimation of the film. For example, the drying may be performed in also a reduced-pressure atmosphere.

After the drying in nitrogen, the film is sublimated or volatilized (step S8), and the cleaning process comes to the end. The sublimation, etc. may adopt a method of, for example, leaving in the air atmosphere, heating with a hot plate, etc. in the air atmosphere, conducting steam treatment, conducting UV treatment, or conducting plasma treatment. The film has a sublimating property attributed to the organic boron compound material. Thus, after the solvent removal by the drying, the film reacts with moisture in the air to turn into gas, so that the film will be sublimated (or volatilized).

More specifically, and for example, the boron-containing film sublimates (or volatilizes) within 24 hours if it is kept in a place of a 40% humidity and room temperature. Also, the sublimation (or volatilization) of, for example, the boron-containing film is promoted by heating. An overly high temperature for heating of this purpose might cause diffusion of boron into the patterns (semiconductor substrate). Thus, the heating temperature is preferably a temperature of, for example, 200° C. or below so that the diffusion of boron into the silicon will be suppressed. Additionally, for example, the boron-containing film tends to accelerate the sublimation (or volatilization) according to an increase in humidity. Still, an overly high humidity can lead to condensation of water, and could result in clogging in the patterns. Thus, when the sublimation, etc. is performed through steam treatment, it is preferable to adopt the treatment temperature equal to or higher than the boiling point of water (100° C.).

Now, the states of the pattern surface during the cleaning process will be described in more detail.

As shown in FIG. 3 (a), a solvent 13 is provided to substitute for the IPA around the pattern surface, as explained for the step S4 in FIG. 2.

Subsequently, as shown in FIG. 3 (b), the film formation step is performed. That is, a solution 14 for forming a film is provided to substitute for the solvent 13. Upon this step, a film (coating) 15 is formed on the pattern surface, i.e., the surfaces of the insulation layer 11 and the insulation layer 12 shaped in line patterns. The film 15 is formed by the solid-liquid interface reaction so as to cover the pattern surface. Accordingly, the film 15 is uniformly formed with substantially a constant thickness, irrespective of the patterns.

Next, the rinsing step with the solvent is performed, and then the pattern surface is dried in a nitrogen atmosphere, as shown in FIG. 3 (c). During the drying, surface tension of the solvent exerts an influence over the line patterns such that the adjacent line patterns are pulled toward each other. This would consequently cause the line patterns to elastically deform and incline, and the upper portions of the adjacent two line patterns might contact each other through their respective films 15. Note that since the surfaces of the insulation layer 12 are covered by the film 15, the insulation layer 12 forming one pattern does not directly contact the insulation layer 12 forming the adjacent pattern.

Next, the film 15 is sublimated. When the film 15 is sublimated (or volatilized), the shapes of the line patterns, once elastically deformed, are restored.

3. Relationship Between Film and Storage Atmosphere

Figure 4:
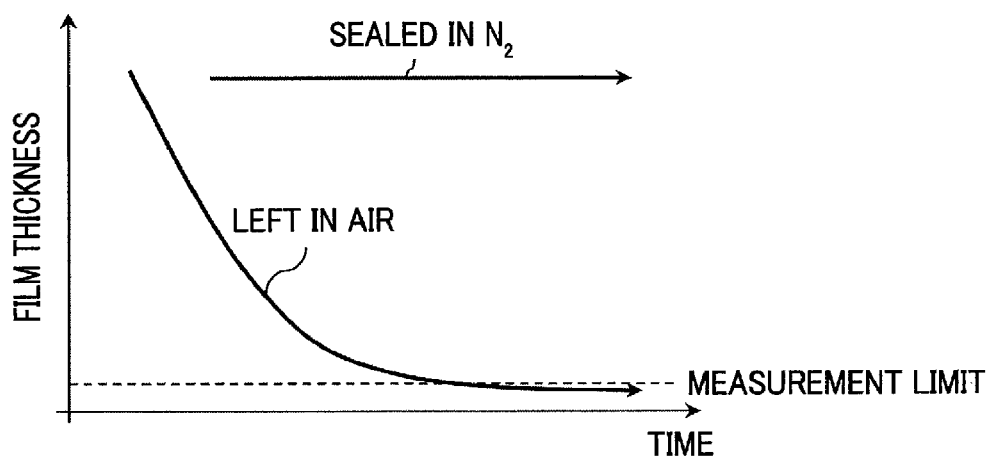
FIG. 4 is a graph showing a relationship between a thickness of a film and a storage time for a semiconductor substrate, in a substrate treating method according to a certain embodiment.

The relationship between the film and the storage atmosphere will be described with reference to FIG. 4. FIG. 4 is a graph showing how the thickness of the film 15 after the drying in nitrogen, i.e., the step S7 in FIG. 2 as explained, relates to the storage atmosphere for the semiconductor substrate 10. The thickness of the film 15 can be confirmed by, for example, a scanning electron microscope (SEM), etc.

As shown in FIG. 4, when the semiconductor substrate 10 is kept in a nitrogen-sealed environment, the thickness of the film 15 hardly decreases, irrespective of the storage time. In other words, the film 15 does not sublimate (or volatilize).

In contrast, when the semiconductor substrate 10 is kept (left) in the air atmosphere, the thickness of the film 15 tends to decrease with the passage of the storage time, as the film 15 is reacting with the moisture in the air to sublimate (or volatilize). Accordingly, if the sublimation (or volatilization) of the film 15 is not desired after the drying in nitrogen, the semiconductor substrate 10 may be kept in the nitrogen atmosphere. If the sublimation (or volatilization) of the film 15 is desired, the semiconductor substrate 10 may be left in the air atmosphere.

While FIG. 4 has assumed an example that deals with the thickness of the film 15, the boron, etc., contained in the solute may be analyzed by energy dispersive X-ray spectroscopy (EDX), electron energy loss spectroscopy (EELS), or other techniques.

4. Effects of Embodiment

With the features according to the embodiment, plastic deformation of patterns that would occur when drying a semiconductor substrate can be prevented, in the course of a cleaning process for the semiconductor substrate. This effect will be described in detail.

Miniaturization of semiconductor devices and increase in number of stacks in semiconductor memories have provided finer patterns and higher aspect ratios, but tend to entail a deteriorated pattern strength. Also, as the miniaturization proceeds, intervals between adjacent patterns typically become narrower. As such, a drying step after wet treatment would likely involve a possibility of pattern displacement due to the surface tension of a liquid used, causing the adjacent patterns to contact and stick to each other, and resulting in their plastic deformation.

FIG. 5 shows such an instance as a comparative example. The example shown in FIG. 5 assumes a state within a cleaning process, where pattern surfaces are dried after IPA substitution.

As shown in FIG. 5, when, for example, DIW is substituted by IPA 16 and then the IPA 16 is removed by drying, patterns are displaced by the surface tension of the IPA 16, whereby the adjacent patterns often contact each other at their upper portions. On this occasion, at the contact face of the patterns, covalent bonding of, for example, silica takes place between two insulation layers 12. This results in plastic deformation of the patterns.

One option for suppressing the pattern deformation during the drying step would be a method of filling the entire pattern structure with a solidification agent and then sublimating the solidification agent, so that the influence of the surface tension of the liquid can be mitigated. However, this method could incur plastic deformation of the patterns due to the compression stress or tensile stress of the solidification agent at the time of filling. More specifically, and for example, if the pattern structure is designed to have various densities, the stress applied from the solidification agent to the patterns in a sparse part would be different from that applied to the patterns in a dense part. Furthermore, when the pattern structure is minute or uses complicated shapes, and there are portions not filled with the solidification agent, the stress applied to the patterns would vary.

In contrast, with the features according to the embodiment, a film with a sublimating property (volatilizing property) can be formed through the reaction at the pattern surface (solid-liquid interface reaction). Therefore, even if the patterns are elastically deformed by the surface tension of a liquid during the drying step for removing the liquid, what will be brought into contact are the films, and the direct contact between the patterns themselves will be prevented. Moreover, even if the films of the adjacent patterns have been brought into contact with each other, the films can be sublimated (or volatilized). Since the deformation produced is relatively small at portions between the patterns, and the deformation is elastic, the elastically deformed patterns can be restored to their original shapes upon sublimating (or volatilizing) the film. Accordingly, in the course of the cleaning process for a semiconductor substrate, the plastic deformation of patterns that would occur during the drying can be prevented.

Moreover, with the features according to the embodiment, the film on the pattern surface can have substantially a constant thickness, irrespective of the difference in density in the pattern structure or the shapes in the pattern structure. Accordingly, the stress to be applied to the patterns from the film can be made constant no matter how the pattern structure is designed, and the pattern deformation due to the stress from the film can be suppressed.

Moreover, with the features according to the embodiment, the pattern deformation due to the drying can be prevented, and accordingly, the fabrication of further finer patterns will be permitted. As such, the embodiment contributes to the advancement of miniaturization and integration of semiconductor devices.

Moreover, with the features according to the embodiment, the film can be formed on metal surfaces. For example, a method for drying, in which the pattern surface is reacted with a silane coupler to have a volatilizing property, is known. This drying method is, however, not applicable to metal materials, as involving the reaction with a silane coupler. On the other hand, the embodiment with the above described features forms the film through the reaction using the water molecules at the pattern surface as the reactant. Thus, the film can be formed also on the metal patterns.

Moreover, with the features according to the embodiment, the film is sublimated (or volatilized), and therefore, there will be no remaining film in the finished products.

5. Modifications, Etc.

The embodiments are not limited to the foregoing descriptions, and can be modified in various ways.

Note that, in the above embodiment, the steps from the wet treatment (step S1) to the sublimation or volatilization of the film (step S8) may be performed by one single-wafer processing type or batch processing type liquid-phase treatment apparatus. Or, the steps from the wet treatment (step S1) to the drying in nitrogen (step S7) may be performed by one liquid-phase treatment apparatus, and the sublimation or volatilization of the film (step S8) may be performed by another apparatus.

While certain embodiments have been described, they have been presented by way of example only, and they are not intended to limit the scope of the inventions. Indeed, the novel methods and systems described herein may be embodied in a variety of other forms. Furthermore, various omissions, substitutions, and changes in such forms of the methods and systems may be made without departing from the spirit of the inventions. The embodiments and their modifications are covered by the accompanying claims and their equivalents, as would fall within the scope and spirit of the inventions.

What is claimed is:

1. A substrate treating method comprising:
   providing a first liquid onto a pattern on a substrate;
   providing, after the first liquid is provided, a second liquid containing a first substance to form a film containing the first substance on the pattern;
   providing, after the second liquid is provided, a third liquid onto the pattern;
   turning the third liquid into gas; and
   turning, after the third liquid is turned into gas, the film into gas.

2. The method according to claim 1, wherein the turning the film into gas comprises leaving the substrate in air.

3. The method according to claim 1, wherein the turning the film into gas comprises heat or steam treatment.

4. The method according to claim 1, wherein the first substance and the film comprise boron.

5. The method according to claim 1, wherein the first substance comprises at least one of trimethoxyboron, triethoxyboron, trimethylboron, triethylboron, and triethylamine borane.

6. The method according to claim 1, wherein the second liquid does not comprise water molecules.

7. The method according to claim 1, wherein
   the second liquid is provided while the first liquid is on the pattern, and
   the third liquid is provided while the second liquid is on the pattern.

8. The method according to claim 1, further comprising providing a fourth liquid onto the pattern,
   wherein the first liquid is provided after the fourth liquid is provided.

9. The method according to claim 8, wherein the first liquid is provided while the fourth liquid is on the pattern.

10. The method according to claim 1, wherein the first substance reacts with water to form the film.

11. The method according to claim 1, wherein the first liquid and the third liquid do not comprise the first substance.

12. The method according to claim 1, wherein the first liquid and the third liquid do not comprise water molecules contents.

13. The method according to claim 1, wherein the first liquid, the second liquid, and the third liquid comprise a same solvent.

14. The method according to claim 1, wherein the pattern comprises a plurality of projections each extending in a first direction, the projections being arranged along a second direction intersecting the first direction.

15. A semiconductor device manufacturing method comprising:
- forming a pattern on a substrate;
- providing a first liquid onto the pattern;
- providing, after the first liquid is provided, a second liquid containing a first substance to form a film containing the first substance on the pattern;
- providing, after the second liquid is provided, a third liquid onto the pattern;
- turning the third liquid into gas; and
- turning, after the third liquid is turned into gas, the film into gas.

16. The method according to claim 15, wherein
the second liquid is provided while the first liquid is on the pattern, and
the third liquid is provided while the second liquid is on the pattern.

17. The method according to claim 15, further comprising providing a fourth liquid onto the pattern,
wherein the first liquid is provided after the fourth liquid is provided.

18. The method according to claim 15, wherein the first substance and the film comprise boron.

19. The method according to claim 15, wherein the first substance comprises at least one of trimethoxyboron, triethoxyboron, trimethylboron, triethylboron, and triethylamine borane.

20. The method according to claim 15, wherein
the second liquid is provided while the first liquid is on the pattern, and
the third liquid is provided while the second liquid is on the pattern.

* * * * *